US006379851B1

(12) United States Patent
Innes

(10) Patent No.: US 6,379,851 B1
(45) Date of Patent: Apr. 30, 2002

(54) METHODS TO PREDICT AND CORRECT RESIST HEATING DURING LITHOGRAPHY

(75) Inventor: Robert Innes, Richmond, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/629,078

(22) Filed: Jul. 31, 2000

(51) Int. Cl.$^7$ .............................. G03F 9/00; G03C 5/00
(52) U.S. Cl. ......................... 430/30; 430/296; 430/942
(58) Field of Search .......................... 430/30, 296, 942

(56) References Cited

U.S. PATENT DOCUMENTS 5,847,959 A  * 12/1998  Veneklasen et al. .. 364/999.999

\* cited by examiner

*Primary Examiner*—Christopher G. Young

(57) ABSTRACT

The present invention relates to methods of predicting proximity heating in real-time as the writing proceeds enabling beam compensation to be performed in real-time. Particular attention is given to vector scanning in which the pattern of writing does not follow prescribed kinematics, but the writing tends to cluster into cells. A library of standard cells is constructed. As writing of the pattern proceeds, the individual flashes are agglomerated into cells that are compared with standard cells to determine proximity heating in the resist as a function of the distance of the previously written cells from the point of present writing, and the elapsed time since writing a previously written cell. Present writing snaps to a sufficiently coarse space-time grid to limit the computational burden but fine enough the represent variations in temperature over space and time. Further agglomeration of cells into super-cells, super-super-cells, etc. are also described. An advantage of the present technique is its applicability to vector scanning and to stenciling techniques for writing patterns on the wafer surface, not dependent on foreknowledge of a particular pattern of writing, as is the case for raster or serpentine scanning.

7 Claims, 7 Drawing Sheets

METHODS TO PREDICT AND CORRECT RESIST HEATING DURING LITHOGRAPHY

BACKGROUND OF THE INVENTION

1. Technical Field

This invention relates to the general field of energy beam lithography and, more particularly, to prediction and correction of the lithography process to compensate for proximity heating of the resist and, most particularly, to correction of proximity heating occurring during resist exposure by means of vector scanning or stencil exposure.

2. Description of Related Art

The fabrication of integrated circuits ("ICs") requires ever more accurate methods for creating patterns on a wafer substrate, typically involving exposure of a resist-coated wafer to a pattern of energy in the form of electromagnetic radiation, electrons or other particle beams. "Positive resists" require exposure of the resist to energy in those areas in which resist removal is desired. "Negative resists" require exposure of the resist to energy in those areas in which resist retention is desired. Both positive and negative resists are commercially useful. Exposure to a pattern of energy may occur through a mask having a pattern of energy-transmissive regions therein, typically fully transmissive or fully opaque although "gray" regions are not inherently excluded. "Photolithography" commonly denotes the exposure of a resist-coated substrate through a patterned mask by means of electromagnetic radiation.

Another general method of writing patterns on a resist makes use of a beam of energy directed only to those regions of the resist-coated surface requiring exposure without screening by an intervening mask. A suitable beam steering mechanism is typically employed along with suitable controls to insure that only the regions of the surface requiring exposure are contacted by the incident beam. The beam may be electrons, ions, neutral particles, collimated laser light or other electromagnetic radiation. However, to be definite in our discussion, we will emphasize the example of a beam of electrons impacting the resist-coated substrate (e-beam lithography), not excluding thereby other forms lithography by means of directed energy beams. The control mechanism may be a simple on-off control to expose the pattern pixel by pixel. The control mechanism may be more complex, controlling the beam intensity, shape, dwell time or other beam parameters, the control of which leads to precise patterning.

In addition to direct beam writing and lithography through a mask, circuit components (e.g. a memory cell) may be exposed in a single flash through a "stencil." Stenciling in this manner may make use of either electromagnetic radiation or particle beams, and numerous uses of the same and different stencils may be necessary to fully pattern the entire surface of the wafer.

Direct beam writing of patterns onto a resist-coated surface is the method presently preferred for creating the masks used in photolithography, but direct writing offers other advantages as well. Among these other advantages of direct beam writing are the avoidance of complications of alignment and registration of the mask with the substrate and the possibility of creating more precise patterns with the use of accurately focused beams. One disadvantage of direct beam patterning in comparison with photolithography is the relatively smaller throughput possible with direct beam writing.

Considering e-beam lithography by way of example and not limitation, the presently employed writing techniques may be classified into general categories as vector scan, raster scan or stenciling. Vector scan typically directs the beam while off to a region of the substrate requiring exposure, then exposes a contiguous region of the substrate to the energy of the beam before moving to another region for exposure. Simply stated, vector scanning "paints" or "tiles" a region of the substrate with beam energy before moving on to expose another region. Most conveniently, beam direction, scanning trajectories, flash size, shape and/or intensity are under computer control, defining the pattern to be written.

Raster scanning directs the beam to all regions of the substrate no matter what pattern requires exposure and adjusts the beam intensity at each point scanned to effect the correct pattern of exposure. The simplest beam control during raster scanning entails having the beam on or off as each pixel is scanned. However, adjustment of beam intensity to numerous levels between full-on and full-off (gray scales) is also feasible in some raster scanning procedures. Stenciling combines use of one or more masks for patterning a single circuit component (such as a memory cell), with a flash exposure of the entire stencil.

Precise exposure of resist requires a detailed understanding of the sensitivity of the resist to e-beam exposure. The exposure of resist to an e-beam, called the dose, is typically measured in microcoulombs per square centimeter ($\mu C/cm^2$). The sensitivity of the resist means the electron dose (in $\mu C/cm^2$) necessary to create the desired pattern in the resist upon development. This sensitivity is a function of the resist composition, the energy of the incident electron beam, the temperature of the resist, the resist development process and other factors as well. The changes of resist sensitivity with its temperature at the time writing occurs is a particular concern of the present invention.

It is helpful to emphasize that exposure of the resist by e-beam impact and heating of the resist are two conceptually distinct phenomena. The chemical activity of the resist leading to its useful lithographic properties is initiated by e-beam impact. The efficacy of electrons in causing this chemical activity is defined as the sensitivity of the resist. The sensitivity of the resist to e-beam impact depends in turn on many factors including the temperature of the resist at the time it is exposed. Thus, changing the temperature of the resist changes its sensitivity which may require changing the dose of electrons, typically by changing the dwell time or beam current (or both) in order to achieve proper exposure. Failing to take into account changes in resist sensitivity with temperature may lead to overexposure of the resist, exposure of the resist in regions not intended to be fully exposed, and less precise patterns. Pattern "blooming" is the undesired result.

Heating of the resist occurs in two ways: 1) As an inherent adjunct effect to the impact by electrons intentionally directed onto the resist for exposure. This heating is always present in e-beam lithography and is taken into account when the resist is calibrated to specify the correct exposure dose. 2) In high voltage lithography, most of the electron beam energy passes through the resist and the underlying mask layer (typically very thin) and penetrates the substrate where most of the beam energy is deposited. (An exception occurs when thin substrates are used, typically in the manufacture of X-ray masks, where the substrate is itself a film so thin that most of the beam energy passes through without significant diminution.) Electron diffusion in a thick substrate deposits the heat from a single e-bean flash in the substrate, typically in a volume 10 or more microns ($\mu$ or micrometers) in lateral extent (perpendicular to the e-beam direction). Subsequent thermal conduction transports a portion of this heat to the substrate surface where it heats the resist in a zone that may be tens of microns in lateral extent a few microseconds following the flash, increasing to a millimeter across after several milliseconds. (Exact numbers will depend on beam energy, the composition of the substrate and its thermal properties). Thereafter the heat has diffused so much as to have no significant effect on resist temperature or, consequently, on resist sensitivity. It is this second type of heating that this invention addresses and denotes as "proximity heating." Such proximity heating depends on the previously written pattern and the time history of the pattern writing. This variability makes proximity heating particularly challenging to estimate in designing a process for high accuracy e-beam writing.

"Proximity heating" as used herein is not to be confused with the "proximity effect" related to the chemical effects of scattered electrons in the resist. Electrons in a beam passing through matter will from time to time encounter atomic nuclei or orbital electrons and undergo deflection from their line of travel (and/or scattering of orbital electrons into the surrounding medium), with or without loss of energy in the deflecting collision. Thus, scattered electrons within the resist may lead to exposure away from the desired exposure zone. The "proximity effect" relates to the chemical effect of these scattered electrons in exposing the resist, perhaps relatively far from the intended exposure zone at which the e-beam is directed. Backscattered electrons scattered from layers below the resist may re-enter the resist and also produce deleterious exposure. Many approaches have been suggested to ameliorate the effects of these scattered electrons as they lead to unwanted exposure of the resist, including that of Veneklasen et. al. (U.S. Pat. No. 5,847,959). Bohlen et. al. (U.S. Pat. Nos. 4,426,584 and 4,504,558) suggest a second exposure to the incident e-beam designed to correct for dosage losses or (for e-beam exposure through a mask) the use of two complimentary masks. Several ways to correct for the electron beam dosage have been suggested, including the work of Watson (U.S. Pat. No. 5,736,281), Ashton et. al. (U.S. Pat. No. 5,051,598), Owen et. al. (U.S. Pat. No. 5,254,438), and Chung et. al. (U.S. Pat. No. 5,432,714). In all cases, however, the focus of this prior work is to prevent or reduce the chemical effect of scattered electrons in causing undesired exposure of the resist. In contrast, the present invention relates to the thermal effect of both incident electrons and scattered electrons as they heat the target indirectly by conduction of heat deposited elsewhere, and the changes in resist sensitivity caused by this heating.

Proximity heating has been the subject of several calculations and measurements. Ralph et. al. describe methods for computing proximity heating by numerical integration of diffusion equations in "Proceedings of the Symposium on Electron and Ion Beam Science and Technology, Tenth International Conference", p. 219–2330 (1983). Babin et. al. also describe methods for the numerical simulation of proximity heating and the comparison of such calculations with measured values. SPIE, Vol. 3048, p. 368–373 (1997) and J. Vac Sci Technol. B Vol. 16, pp. 3241–3247 (1998). Additional calculations of proximity heating and comparison with measured values have been reported by Yasuda et. al. in J. Vac Sci Technol. B Vol. 12, pp. 1362–1366 (1994).

Calculations of proximity heating may be based upon a numerical solution of the appropriate diffusion (partial differential) equations.

$$(c\partial/\partial t - \kappa \nabla^2)T(r,t) = Q(r,t) \qquad \text{Eq.(1)}$$

where T is the temperature, r is the position as a vector in 3-space, t is time, c the volumetric heat capacity and $\kappa$ the thermal conductivity of the substrate. $\nabla^2$ is the Laplacian operator. Q(r,t) describes the space and time distribution of sources of heat (which may be negative as heat sinks). For most cases of practical interest, c and $\kappa$ are substantially independent of temperature, resulting in Eq (1) being linear for thermal diffusion in the absence of sources (Q=0). That is, if $T_1(r, t)$ and $T_2(r, t)$ are each solutions of Eq. (1) for sources $Q_1$ and $Q_2$ respectively, then so $T_1(r, t)+T_2(r, t)$ is a solution of Eq. (1) for source $Q_1+Q_2$.

In principle, an accurate solution for the resist temperature may be obtained by a two-step process for the solution of Eq. (1). The first step is to obtain Q(r, t), typically by means of a Monte Carlo simulation of electron impact onto the substrate. Equations describing the motion of an electron as it impinges upon and interacts with the substrate are numerically integrated to ascertain the path and energy deposition for a typical electron. This is repeated many times over a statistical sample of impinging electrons to obtain the rate of energy deposition in the substrate as a function of position and of time. The statistical sample is chosen to simulate the voltage, intensity, beam shape, etc. for a single flash. Commercial software is available for solving the thermal diffusion equation, Eq. (1) for the heat input thus obtained, leading to accurate results of resist temperatures resulting from a single flash, within the numerical precision of the calculations. ANSYS is one commercially available software package making use of direct numerical integration for solving the thermal diffusion equations. TEMPTATION is another commercially available software package making use of Green's function procedures for solving the thermal diffusion equations for the Monte Carlo derived heat sources. Equivalent results are expected for either approach.

In principle, the above technique of flash-by-flash Monte Carlo simulation of heat deposition followed by numerical solution of the diffusion equation may be repeated for each flash in the pattern being written. The linearity of Eq. (1) permits these many solutions to be summed, yielding the temperature at any point in the resist. More particularly, the temperature at the point of the resist presently being written by the electron beam is the primary concern in order to insure correct exposure of the resist and accurate patterns. However, direct solution of the diffusion equation by the above techniques is much too slow to allow correction of the writing process for proximity heating to occur in real-time. Faster numerical procedures are necessary. In deriving useful approximations for such proximity heating, raster scanning offers some simplifications deriving from the predictability of the scanned path. That is, every point (pixel) in the previously scanned pattern (whether or not actually written) has a known relationship in space and time to the point presently being written. Thus, raster scanning relates the location and the time of writing of all pixels in the pattern in a simple manner that permits simplifications in the determination of proximity heating. These simplifications have been utilized by Veneklasen et. al. (U.S. Pat. No. 5,847,959) and Innes et. al. (U.S. patent application Ser. No. 09/343,960) to simplify the determination of proximity heating during raster scan patterning such that real-time correction of the beam during writing is feasible.

However, vector scanning paints or "tiles" various areas of the substrate in a largely unpredictable manner. Thus, unlike raster scanning "when" in the past a point on the substrate was written provides almost no information about "where" on the substrate it was written, with the caveat that during the process of tiling, the writing tends to cluster in a contiguous region. As described elsewhere herein, this tendency to cluster in vector scanning is utilized to accelerate the determination of proximity heating according to the present invention, but is not an inherent limitation in the scope of applicability of the present invention. Conversely, clustered writing during vector scan patterning tends to exacerbate proximity heating, leading to temperature increases exceeding those of raster scanning by perhaps by a factor of 5–10.

The present invention relates to procedures for approximating the solution of the full thermal diffusion problem particularly appropriate for vector scanning or stenciling. It is shown below that a substantial reduction in the computer time necessary to predict proximity heating is achieved, permitting correction of the writing process to occur in compensation for this heating. More accurate patterning is the expected result.

BRIEF SUMMARY OF THE INVENTION

Precise writing of patterns in a resist requires precise exposure of the resist which, in turn, requires precise knowledge of the sensitivity of the resist to e-beam impact. Resist sensitivity depends upon several factors including the temperature of the resist at the time of writing. Thus, the present invention relates to methods and procedures for determining resist temperature during processing and adjusting process parameters, including reducing the dwell time or beam current, to compensate for increased resist sensitivity. Typically, the resist temperature rise predicted by the present invention for the point of writing will be multiplied by a factor relating to the temperature sensitivity of the resist. The result is a correction applied to the dwell time or beam current to provide more accurate resist exposure. The correction will typically be a multiplicative factor less than 1 by which the energy deposited by the beam is to be adjusted to correct for proximity heating at the point of writing. It is envisioned that e-beam dwell time or e-beam current of each spot or "flash" may be adjusted. Pattern blooming is thereby reduced.

The present invention relates to methods of predicting proximity heating in real-time as the writing proceeds enabling beam compensation to be performed in real-time. Particular attention is given to vector scanning in which the pattern of writing is largely unpredictable, but the writing tends to cluster into cells. A library of standard cells is constructed. As writing of the pattern proceeds, the individual flashes are agglomerated into cells that are compared with standard cells to determine proximity heating in the resist as a function of the distance of the previously written cells from the point of present writing, and the elapsed time since writing a previously written cell. Further agglomeration of cells into super-cells, super-super-cells, etc. is also included within the scope of the present invention. An advantage of the present technique relates to its applicability to vector scanning and to stenciling techniques for writing patterns on the wafer surface, not dependent on foreknowledge of a particular pattern of writing, as is the case for raster or serpentine scanning. Thus, a generalization over the prior art is achieved. Advantages of the present invention include the prevention or mitigation of pattern blooming as incident electrons heat the resist and broaden the region of exposure applicable to vector or stencil writing of patterns.

BRIEF DESCRIPTION OF THE DRAWINGS

The figures herein are schematic and not drawn to scale.

DETAILED DESCRIPTION OF THE INVENTION

In the following description and figures, similar reference numbers are used to identify similar elements.

The general mode of operation of e-beam lithography makes use of a focused beam of electrons, accelerated through a voltage, typically 1000 volts (1 kV) and above. Lower voltage e-beams are more effectively stopped by the resist layer, thereby more efficiently exposing the resist. Higher voltage e-beams, which scatter less in the resist, are preferred for their ability to be formed into more precisely focused beams, resulting in more accurate lithography and the ability to fabricate smaller patterns. "High voltage" e-beams herein is commonly understood to mean e-beam energies above approximately 10 kV. Beam energies as high as 50–100 kV are used. However, high voltage (or, equivalently, high energy) e-beams produce undesired heating side effects, the amelioration of which is one object of the present invention.

Figure 1:
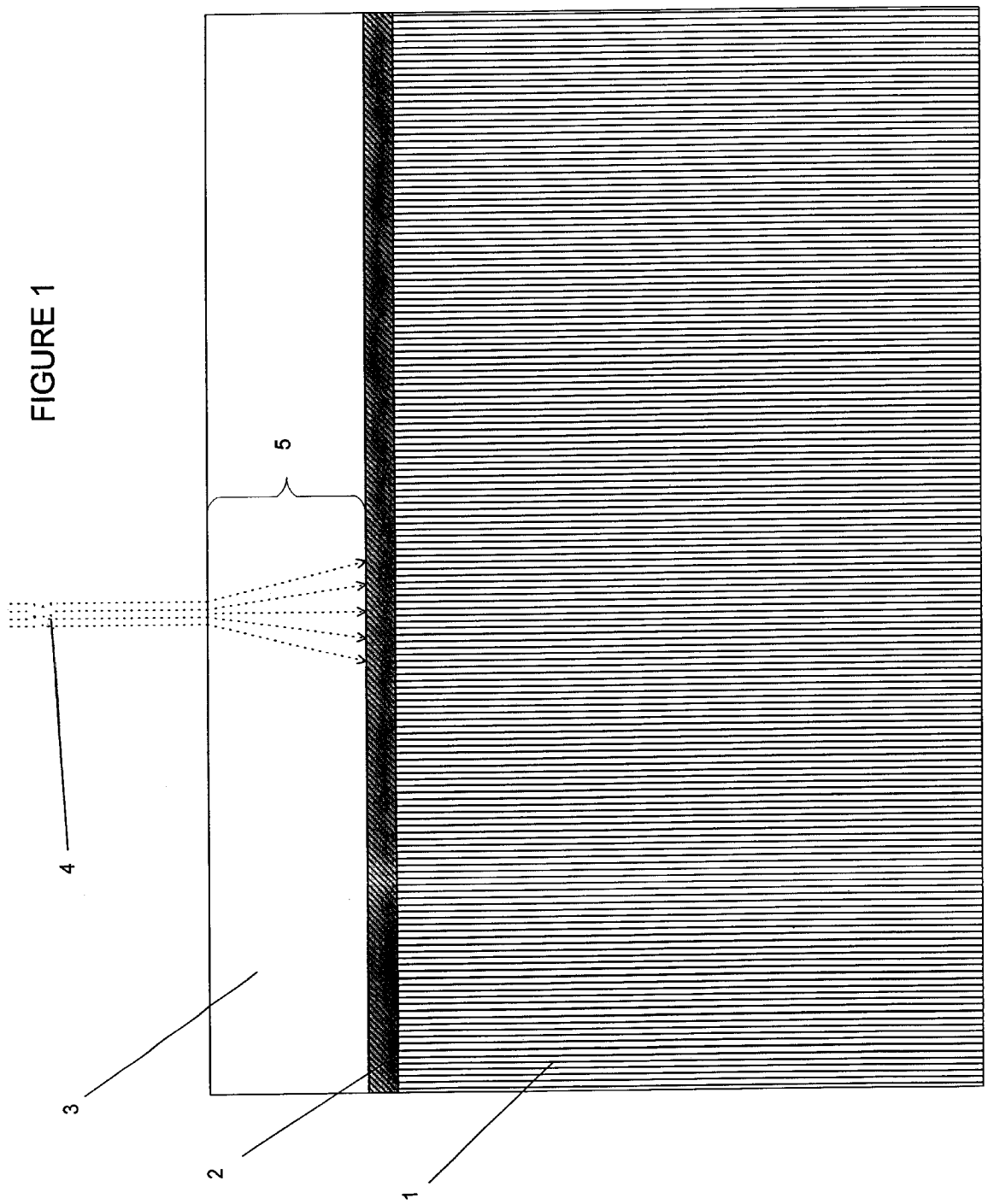
FIG. 1: Schematic cross sectional depiction of low energy e-beam impact on a substrate, a mask to be etched and a layer of resist.

FIG. 1 depicts schematically and in cross section a beam of low energy electrons (less than approximately 10 kV), 4, incident on a layer of resist, 3. Typically, resist layer, 3, will be relatively thin, around 0.5 $\mu$m ("microns "=$10^{-6}$ meter). Resist, 3, overlies the layer to be etched, 2, all of which typically are supported by a reasonably thick substrate, 1. For the manufacture of lithography masks, layer, 2, will be generally be the mask material, typically a film of proprietary composition containing chromium and commonly very thin compared to the resist layer. Substrate 1 is typically glass and may be considered to be infinitely thick as none of the effects encountered in e-beam lithography relevant to the invention described herein are affected by the lower surface of a thick glass layer, 1 (the lower surface is not depicted in FIG. 1). Very thin substrates, as would typically be encountered in the fabrication of x-ray lithography masks, are an exception. FIG. 1 (in common with all other figures herein) is schematic only and not drawn to scale.

For a low energy beam as depicted in FIG. 1, significant dissipation of energy and spreading of the e-beam occurs in the resist layer, commencing virtually immediately upon impact with the resist surface. This spreading effect is depicted as 5 in FIG. 1. The spreading of low energy e-beams in width may be commensurate with the depth of penetration. Thus, low energy e-beams tend to scatter in the resist layer, exposing thereby a larger range of resist than desired and exposing the resist in different patterns than intended, broader than the incident beam. This "pattern blooming" is the result of the chemical effects initiated by the interaction of scattered electrons with the resist or the "proximity effect." Backscattering from layers underlying the resist layer also leads to unwanted exposure and pattern blooming. The creation of a precise patterns on layer 2 is facilitated by minimal spreading of the e-beam on passage through the resist which favors the use of higher energy beams.

Use of high energy beams requires both higher voltage and higher beam currents. Low energy e-beams deposit a reasonably large fraction of the beam energy in the resist layer where it is needed to expose the resist. Therefore, low energy e-beams require less incident beam intensity (beam current) since more efficient use is made of the available beam intensity in developing the resist. The energy deposited in the target is thus typically significantly less for low energy e-beams since both current and voltage are reduced from that used in high energy e-beam lithography. That is, energy deposited is the product of beam voltage×beam current×exposure duration and both voltage and current are reduced for beam energies less than about 10 kV.

By way of illustration and not limitation, we compare the exposure of resist by a 10 kV beam with that caused by a 50 kV beam. It is noticed experimentally that as beam energy increases the current must increase almost linearly with beam energy to continue to expose the resist adequately. Thus, increasing the beam energy by a factor of 5 from 10 to 50 kV requires a concomitant increase in current by a factor of approximately 5 to adequately expose the resist. The energy deposited per e-beam pulse (or flash) is volts× amps×(pulse duration) which increases by a factor of approximately 25 in this example for equal pulse lengths. Most of this energy generated at high beam voltages ends up as heat deposited in the substrate.

Figure 2:
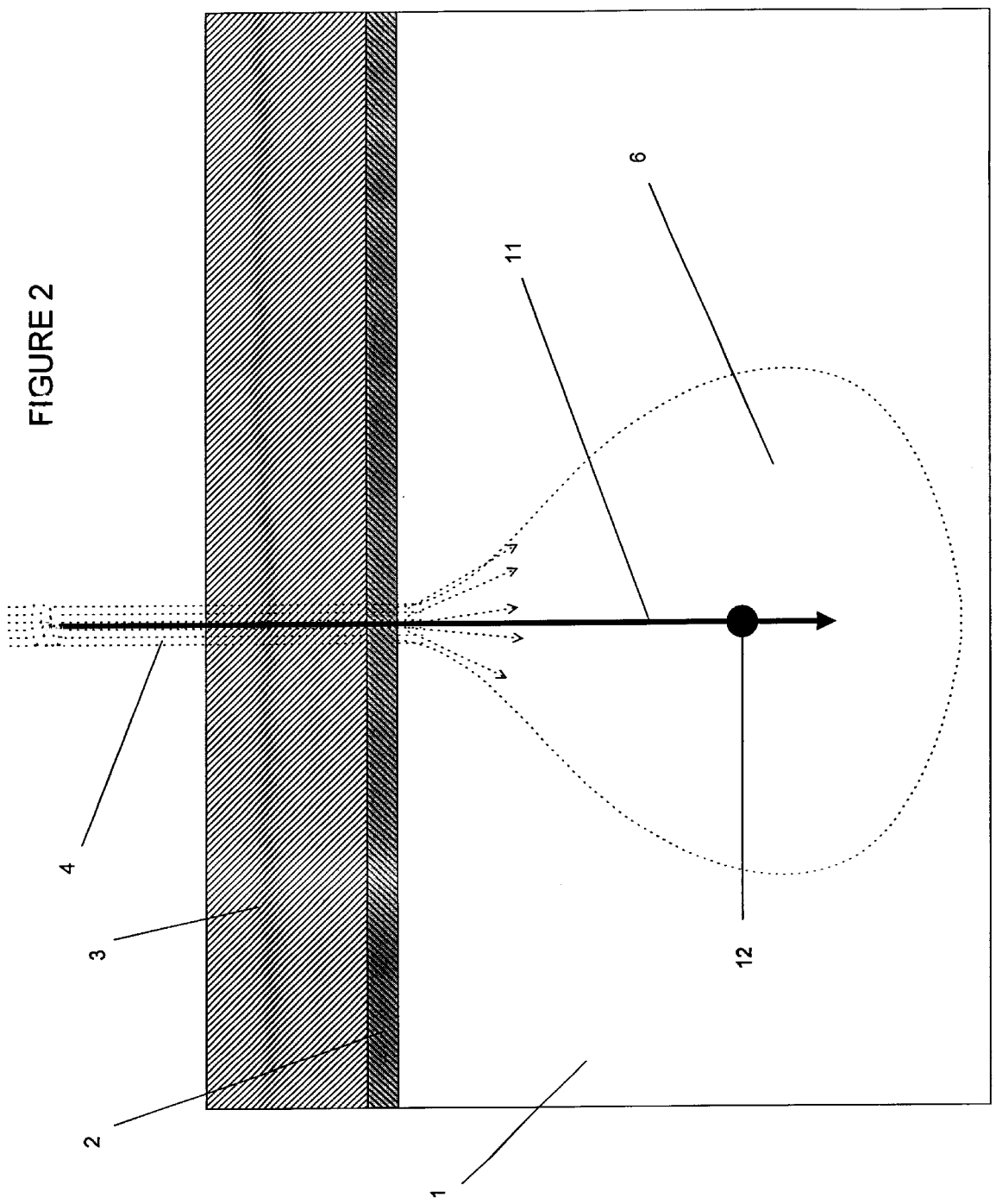
FIG. 2: Schematic cross sectional depiction of high energy e-beam impact on a substrate, a mask to be etched and a layer of resist, depicting heat deposited in the substrate.

FIG. 2 depicts schematically in cross section (not to scale), e-beam, 4, incident on resist, 3, at high incident beam energies, typically round 50 kV. Beam spreading depicted as 5 in FIG. 1 is typically negligible in the resist layer, 3, for high energy beam impacts as depicted in FIG. 2. Such high energy beams tend to pass through resist layer, 3, mask layer, 2, and proceed well into the glass substrate, 1, before substantial beam spreading occurs. A heated zone, 6, is thereby created in substrate 1 as the e-beam comes to rest. Typically, for electrons of about 50 kV, zone 6 will be approximately 20 $\mu$m in diameter (micron=$10^{-6}$ meter) with its central point, 12, about 10 $\mu$m below the upper surface of glass substrate, 1. If the incident e-beam, 4, has cylindrical symmetry about its central axis, 11, then the heated zone, 6, will likewise be rotationally symmetric about 11. However, many writing methods make use of beam cross sections that are square, rectangular or otherwise lack rotational symmetry about the beam axis. Typically these deviations from cylindrical symmetry are minor and can be neglected, although a possible exception may arise in the case of stencil exposures. In many cases of practical interest, insubstantial errors typically result when heated zone, 6, is treated as rotationally symmetric about axis 11 even when non-cylindrical incident beam profiles cause this not to be precisely true.

As noted above, high voltage e-beams will typically deposit much more energy in substrate, 1, than will low voltage beams, such substrate-deposited energy increasing by approximately the square of the beam energy (as the need for increased current must also be met). The energy per pulse may not be substantial, but millions or indeed hundreds of millions of pulses impact the substrate in fully exposing the resist. Therefore, substantial heating of the substrate, 1, may occur with high energy electron beams. Direct heating of the resist layer by the incident e-beam may be significant, but is readily predictable from the applied dose and, therefore, can be compensated by calibration. However, proximity heating of the point at which writing is currently occurring is variable since it is affected by conduction from regions within the substrate where heat was deposited by numerous earlier pulses. Thus, proximity heating depends on the pattern being written and the timing and ordering of past pulses. The present invention determines the resist temperature at the point of writing from proximity heating and provides the data enabling appropriate beam adjustments.

Figure 4:
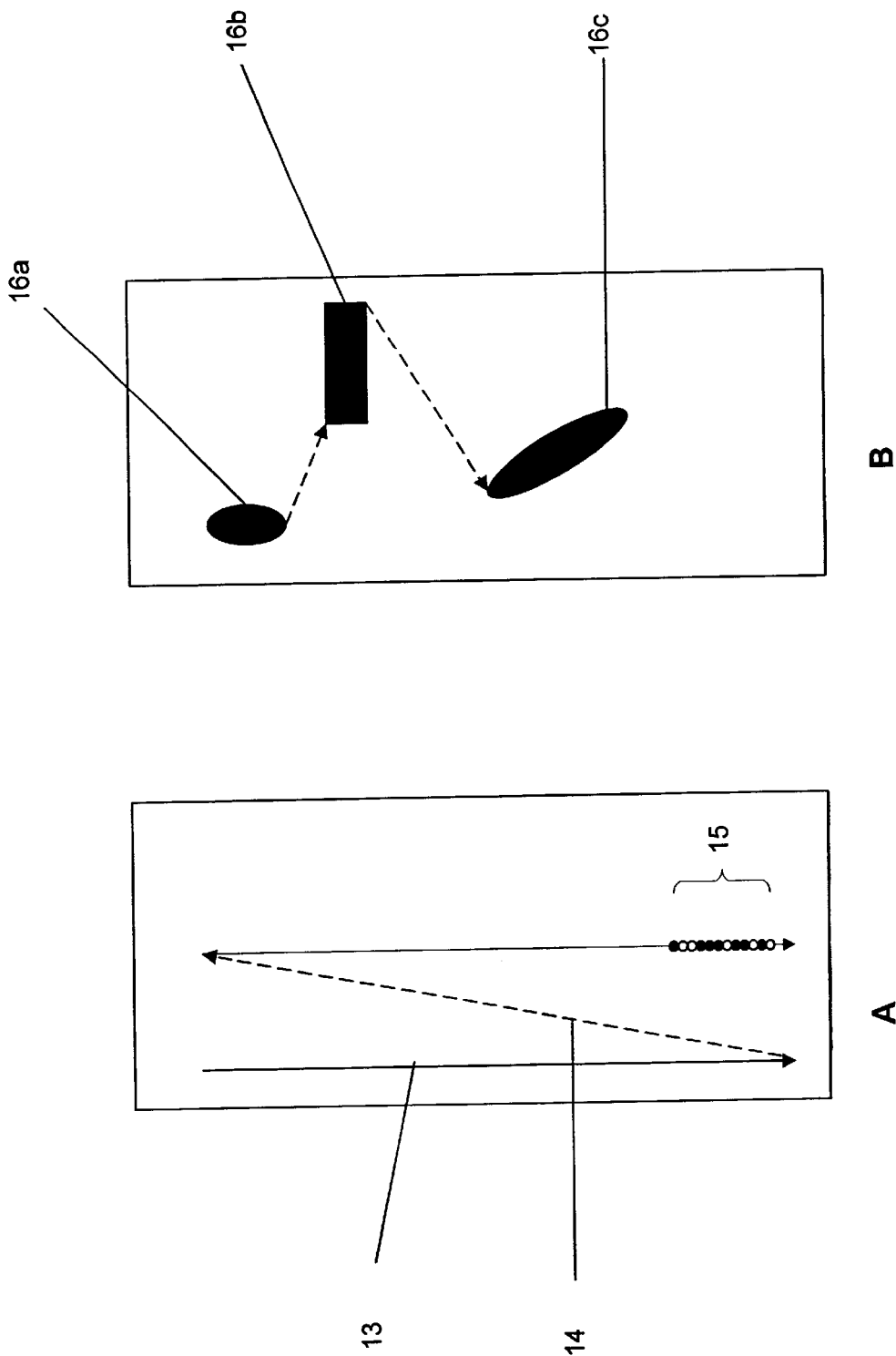
FIG. 4: Schematic depiction of raster and vector scanning.

FIG. 4 depicts raster scanning in FIG. 4A. Raster scan electron beam lithography machines typically scan the electron beam in a linear path, 13, about 1 mm in length every 25 microseconds as the mechanical stage moves the substrate in an orthogonal direction at a speed of about 1 cm/sec. The time between the end of one beam scan and the start of the next is about 5 microseconds, called "flyback time." The scan sequence may be raster (as depicted in FIG. 4A) or serpentine in which adjacent scan lines are oppositely-directed. 15 in FIG. 4A depicts the pixel-by-pixel writing characteristic of raster scanning in which the electron beam is directed at every point along the scan path and writing (●) or not (○) occurs pixel by pixel. Writing at gray levels between full on or full off are also possible in raster scanning but not depicted in FIG. 4A.

In contrast, FIG. 4B depicts vector scanning in which several distinct regions 16a, 16b, 16c, are separately tiled by the scanning beam. Within each region, the beam may be adjusted as to shape and dwell time, dragging over the exposed region to provide the full exposure required before moving to the next region.

It is observed with some resists that raster scans may increase resist temperatures by amounts of the order of 20° C., while vector scans may increase resist temperature up to 100° C. The commonly used Novolac resists change their sensitivity with temperature by approximately 0.2% per deg. C. That is, a 100° C. variation in resist temperature will vary its sensitivity by approximately 20%. This will have a non-trivial blooming effect on e-beam patterns, especially for very fine lithography.

Figure 3:
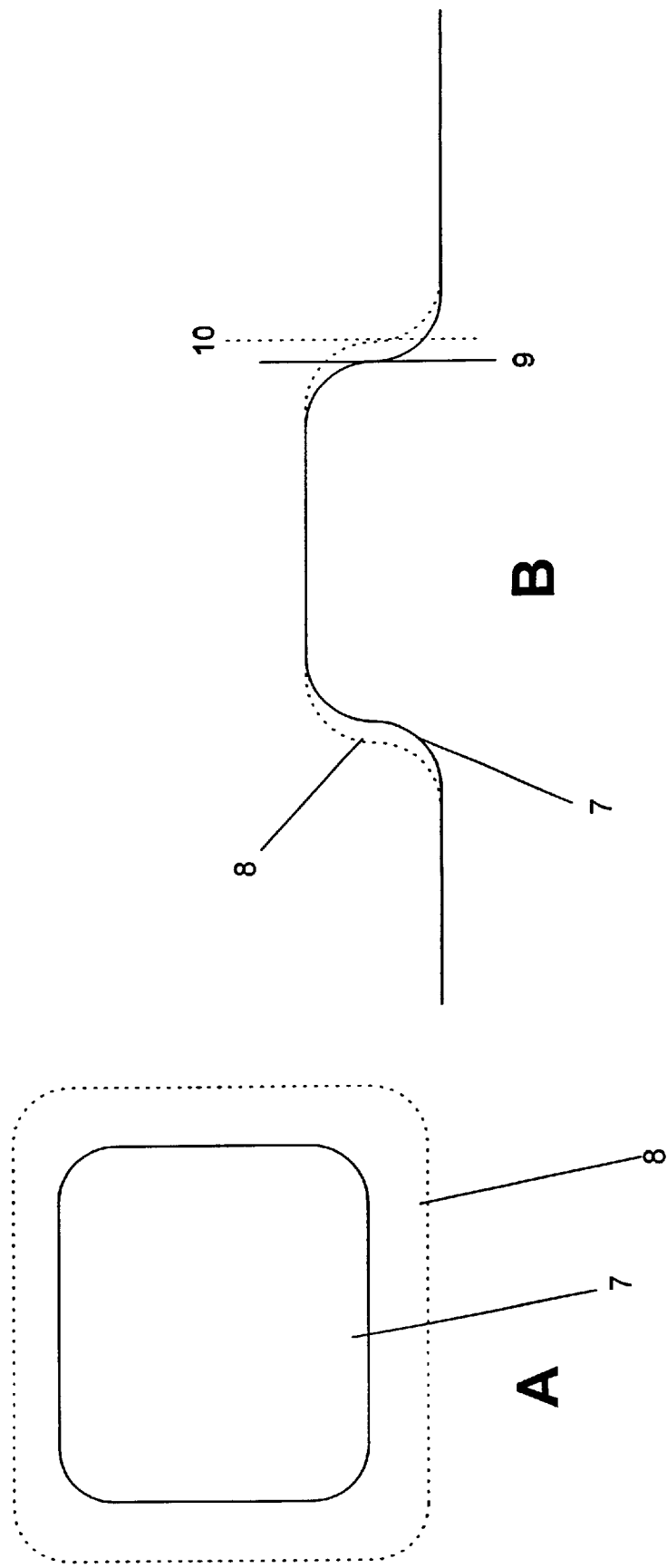
FIGS. 3A, 3B: Schematic top view and side view respectively of regions of exposed resist depicting pattern blooming by overexposure.

FIG. 3 depicts pattern blooming that will typically result from increasing resist sensitivity. 7 in FIG. 3 depicts the desired pattern of exposed resist in top view (FIG. 3A) and side view (FIG. 3B). The pattern and process designer will plan for e-beam exposure such that exposure point 9 (for example) occurs at the desired pattern boundary. However, increased resist sensitivity may lead to full exposure of resist by less-than-expected e-beam dose. That is, the pattern edge moves to position 10, resulting in a broadened pattern depicted by 8.

Babin and co-workers have discussed the relationship between the dosage of electrons necessary for effective resist exposure, the incident e-beam current and the resist temperature in SPIE, Vol. 1671, pp. 93–97 (1992). This research indicates that control of e-beam dwell time or e-beam current can be an effective method for controlling and avoiding resist overexposure that would otherwise occur due to proximity heating of the resist. Thus, the present invention relates to methods and procedures for determining resist temperature during processing and adjusting process parameters, including reducing the dwell time and/or the beam current, to compensate for increased resist sensitivity. Typically, the resist temperature rise predicted by the present invention for the point of writing will be multiplied by a factor relating the temperature sensitivity of the resist. The result is a correction applied to the dwell time or beam current to provide more accurate resist exposure. The correction will typically be a multiplicative factor less than 1

(0.97 for example) by which the dwell time and/or the beam current is to be adjusted to correct for proximity heating at the point of writing. Pattern blooming is thereby reduced.

As noted elsewhere herein, there has been significant research in calculating proximity heating for e-beam lithography. Accurate predictions require using Monte Carlo simulations to represent single flash heat sources and various techniques exist for solving the thermal diffusion equation including finite element, finite difference or elaborate analytical approximations, but tend to require very large amounts of computation. The present invention relates to methods for predicting proximity heating in a very rapid manner, thereby making it possible to compute proximity heating corrections to the e-beam writing process in real-time as writing proceeds. In principle, it would be possible to calculate proximity heating effects for a stipulated e-beam lithography process in advance of actual performance of the writing process. Thus, one could select a candidate e-beam writing process, specifying all beam and scanning parameters. The proximity heating could be calculated using the methods referred to above taking however long may be necessary. The candidate process parameters would then be adjusted to compensate for proximity heating effects. If necessary, the cycle of proximity heating calculation and parameter adjustment could be iteratively re-done as many times as necessary to converge to a stable set of processing parameters. All of this would be performed off-line (that is, before e-beam lithography begins and typically remote from the e-beam equipment itself). For most practical applications, this approach is not feasible.

One aspect of the present invention relates to methods for predicting the proximity heating of the resist much more rapidly than previous techniques for the purpose of computing proximity heating in real-time as e-beam writing is underway. The primary advantage of real-time evaluation of proximity heating is best understood in view of the detailed performance of e-beam lithography equipment as used in the manufacture of integrated circuits with emphasis on vector scanning. Patterning by means of stenciling may also make use of the techniques of the present invention A typical modern integrated circuit (such as Pentium® or the like) may contain $10^7$ transistors and be fabricated in 20 or more layers of lithography. Each lithography layer requires a mask, typically manufactured by means of e-beam lithography. The chip designer provides a data file containing the information as to how the components are to be arranged on the chip, layer by layer. These files are typically organized hierarchically, in a form convenient for the circuit designer but inconvenient for controlling the movement of the electron beam across the substrate and the writing of the patterns. Files must be "fractured" in order to produce "flat files" that have the form useful for controlling the particular e-beam writing machine. The fracturing procedure will typically vary from machine to machine depending on the particular specifications and capabilities of the machine.

Proximity heating must be determined from the flat file since only the flat file format contains the information pertaining to the spatial order and time order in which the pattern will be written, and the beam intensity impinging upon various areas of the substrate. Producing the flat file prior to writing the pattern would, in principle, permit processing to be done off-line to adjust the pattern writing process to account for proximity heating. However, flat files are typically very large, perhaps containing as many as $10^{12}$ bytes making it difficult to fracture the file before writing the pattern. Therefore, fracturing the file into the flat format is typically done as needed in real-time for immediate use by the e-beam writing machine.

The present invention relates to methods of predicting proximity heating in a time scale comparable with the time of e-beam writing, primarily in connection with vector scan e-beam lithography although stenciling is not inherently excluded from the practice of the present invention. The file as typically produced by the chip designer is fragmented into the flat format for concurrent use by the e-beam lithography machine and by the method of the present invention. Unlike previous methods for calculating proximity heating, the present invention is capable of predicting the proximity heating of resists in a time scale that permits adjustment of the e-beam writing process in response thereto.

Determination of proximity heating for raster scan e-beam writing was a subject of U.S. Pat. No. 5,847,959 and the pending patent application of Innes et. al. (U.S. patent application Ser. No. 09/343,960. Vector scan e-beam lithography has additional challenges to be overcome in determining and correcting for proximity heating of the resist: 1) The pattern traced out by a vector scan, in contrast to raster scan, does not follow prescribed and predetermined kinematics. For raster scan, if the position and time at which point i was written is given, the location and time at which point i+N will be written is uniquely known for any i and N. One cannot predict algorithmically (in general) where a vector scan will write next. 2) Vector scan machines tend to write contiguous regions before moving onto other contiguous regions. Thus, the good news is that vector scan writing is not completely random, tending to cluster at one location before moving on to another location. The bad news is that writing in clusters tends to cause proximity heating of the resist much greater than the proximity heating caused by raster scanning, perhaps by a factor of 5–10. Thus, vector scanning tends to have a much more serious problem with proximity heating than does raster scan. However, vector scanning is not without its advantages. For example, raster scanning is an inexorable process, incapable of delay or interruption once begun without serious disruption of the overall writing process. On the other hand, vector scanning is more tolerant of interruptions or delays, being readily capable of resuming the writing process at the point of interruption without major disruption to the overall lithography. Thus, some embodiments of the present invention may require computations to be performed that may delay the writing by modest amounts, but such timing delays must be taken into account in determining the temperature of the resist since the elapsed time since a pattern was written is an important factor in determining the present temperature, even if some portion of the elapsed time results from computational delay. Unlike raster scan, modest delays in vector scanning are tolerable and may be incurred when justified by the increased precision in writing brought about by pausing momentarily to perform a better computation.

We describe a particular embodiment of the present invention for the specific example of vector scanning (as vector scanning is typically implemented in modern equipment) in order to provide a concrete description and not to imply any inherent limitation of the present invention to vector scanning. The procedures described herein for predicting and correcting for proximity heating may also be applied for stenciling, and will be noted in more detail as encountered.

Figure 5:
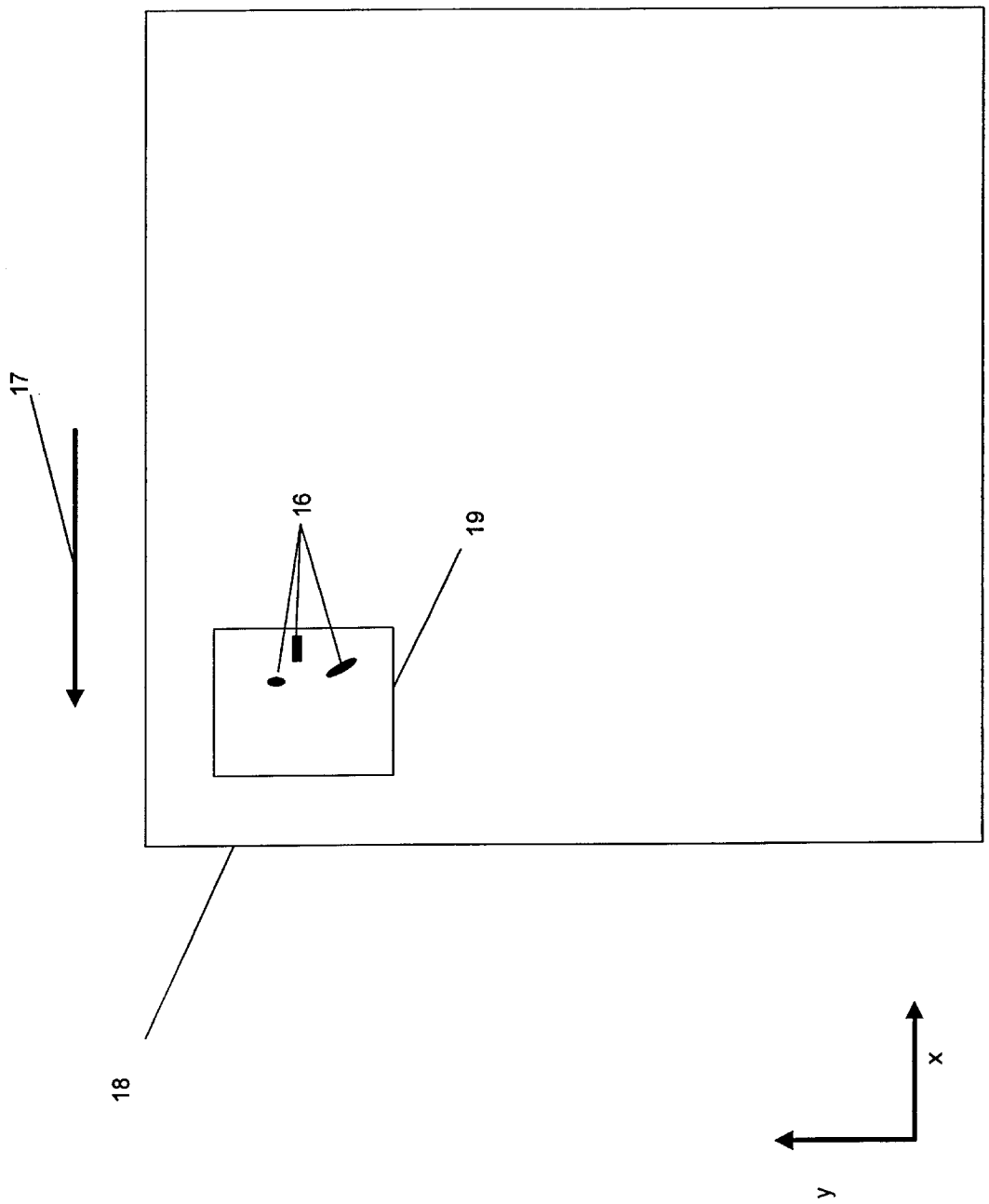
FIG. 5: Schematic depiction of major and minor exposure fields.

FIG. 5 depicts a typical vector scanning procedure for writing patterns onto a wafer as viewed from above, along the direction of the e-beam performing the writing. Only a portion of the wafer is shown. Three types of motion are to be distinguished. 1) Mechanical motion of the stage (17) translates the wafer or mask within the field of the e-beam at relatively low speeds. Although 17 depicts only motion in the x direction, mechanical translation of the wafer will generally be in both x and y directions (in combination or sequentially) to expose the entire surface of the wafer to the e-beam. 2) "Major field" motion is typically a relatively infrequent displacement of the e-beam target area around the surface of the wafer, but of relatively large magnitude (typically around 1 mm). The major field exposes a relatively large area to e-beam impact. The major field, depicted as 18 in FIG. 5, is typically about 1 mm on a side, depicted as approximately square in FIG. 5. In one embodiment, major field deflection is accomplished by means of magnetic deflection of the e-beam. Magnetic deflection introduces distortions into the motion of the beam, requiring a "settling period" before a precise beam for precise writing is re-established in the new location in the major field. Typically, approximately 100 $\mu$s are needed to allow the beam to settle once directed to a new major field location. Several "minor fields" will typically be located within each major field. A typical minor field is depicted as 19 in FIG. 5, lying within major field, 18. 3) The third type of motion typically is rapid electrostatic deflection employed to move the electron beam from one flash location to another within a minor field. A minor field is commonly square or rectangular approximately 50$\mu$ in lateral extent. The e-beam is directed from place to place within the minor field to tile the appropriate region in the vector scanning procedure previously described and depicted as 16 in FIG. 5. Typically, magnetic major field beam deflections are used to move the beam to new minor field locations within the major field. Thus, the three types of motion are summarized as 1) mechanical (or stage) motion to move from one major field to another. 2) Major field motion (typically magnetic deflection) to move to new minor field locations within a major field 3) Deflections to accomplish vector scanning and writing of the pattern within the minor field, typically electrostatic and very rapid.

The present invention accelerates the determination of proximity heating for vector scanning by agglomerating heating effects of distinct e-beam flashes into "cells" and treating the cells as a single unit for purposes of proximity heating. A judicious choice of cells permits the effects of heating by individual flashes to be collected and treated as a single heating source, greatly speeding up the determination of proximity heating while retaining an acceptable level of accuracy. This is accomplished by the present invention in a series of steps generally described as follows:

1) A library of "standard cells" is pre-computed and stored for future reference. A standard cell provides a table of proximity heating effects at various distances from the standard cell and at various times after the standard cell is written. The library of standard cells will typically be catalogued according to the relative charge deposited by the flashes within the cell. For the common instance of an e-beam with constant current, the deposited charge is proportional to the flash duration and flash area. Each prototypical cell in the library assumes unit total charge because the heating is simply proportional to the actual charge deposited and is proportional to the current density which is typically not varied during the writing of a mask or wafer.

2) As the actual pattern is written by the vector scan machine, the flashes producing the pattern are agglomerated into "cells" As specified in detail below, each cell (say the k'th) will have a "time of birth" will "grow to maturity" (at which time no further growth is permitted). Upon attaining maturity (and no further growth is permitted), each cell, k, is characterized by two location numbers, the (x,y) location of its "charge centroid" and a single time number (the "time centroid") that determines the place and the time from which heat dissipation is measured. Cell size is delimited by the distance from the cell spatial charge centroid to the most remote flash in the cell measured in the x,y plane of the resist. If this distance would exceed a preset limit, the cell is considered mature and a new cell is started. Because dwell times in vector scan machines are typically 50 ns or longer, performing a computation of the centroids and testing the maturity limits is possible with a dedicated processor, which requires as input information the dwell and area of each flash. Described in detail below, the time centroid is a single point in time which "starts the clock" in determining heat dissipation from cell k. Future writing at points on the resist too remote in space from the k'th charge centroid and/or too remote in time from the k'th time centroid will be unaffected by heat deposited in cell k.

Cell size is also delimited by the age of a cell. If some preset age limit would be exceeded, the cell is considered mature and a new cell is started. These rules for imposing size and age limits on a cell may allow some flexibility. For example, if only a few additional flashes are required to complete the writing of a contiguous tiled area, these few additional flashes may be added to the existing cell, without starting a new cell.

In writing patterns in the resist, proximity heating caused by previously written patterns of flaches will be determined by treating previously matured cells as heating units. For writing that is more remote in time and space, cells in turn may be agglomerated into super-cells, super-cells into super-super-cells etc. as described below, neglecting cells too remote in space or time to significantly contribute to heating. This cellular agglomeration achieves great simplification in the determination of proximity heating for vector scan e-beam lithography.

3) The temperature at the location of each flash is computed for points snapping to a space-time grid. This grid need be no finer than is required to represent temperature variations which are spatially blurred by electron diffusion in the substrate and by subsequent thermal diffusion. If the temperature at the grid point to which the current flash snaps does not exist, it is computed by looking up the tabulated temperature that each cell of past writing would significantly contribute to the temperature of the current grid point and these temperatures are additively accumulated. The temperatures are obtained for each cell from the library counterpart that most nearly matches its defining characteristics, scaled by the cell charge and current density, using as arguments in the lookup the elapsed time and distance to the current grid point from the cell centroid in time and space. If subsequent flashes snap to the same grid point, the temperature need not be recomputed. The heating processor may be provided with look ahead information from the pattern generator to anticipate which grid points may next require temperatures or it may guess and compute partial temperatures at grid points proximate to the current point. Temperatures at future grid points are necessarily partial because they will be influenced by writing not yet having occurred, but these calculations will reduce computing time when the final temperature at a grid point is needed. If the current flash snaps to a new grid point in space and time for which the temperature is unknown, the pattern generator can be stopped until the temperature is available. This characteristic of vector scan machines that permits such interruption was discussed earlier. At 50 kV beam voltage, the grid can be fairly coarse, say approximately 5–10 $\mu$m, so a machine writing with 1 $\mu$m square flashes need not require such stoppages frequently.

1) Standard Cell Library

One component of the prediction and correction for proximity resist heating according to the present invention relates to the construction of a library of standard cells. The temperature of the resist at the point of current writing is the sum of heating effects of all previously written flashes. The use of cells permits the agglomeration of a number of previously written flashes into a single cell, each such cell characterized by a small number of cell parameters. The determination of the heating effect of all previously written flashes reduces to the determination of the heating effect of all previously written cells (and in some special circumstances to previously written flashes within the present cell). The library of standard cells is a rapidly accessible data base that permits cell thermal data to be retrieved rather than recomputed. Thus, generation and storage of the standard cell library to achieve accuracy in temperature prediction and rapid accessibility is a goal of this component of the present invention.

The library of standard cells consists of several cell types. We define cell types in terms of a small number of parameters. The simplest standard cell would be one describing the temperature $T(r,t)$ due to a unit charge deposited at a single instant at a single point. $T(r,t)$ denotes the temperature at an elapsed time t following deposition of the charge and at distance r from the point at which the charge has been deposited (measured in the plane of the resist $r=(x,y)$). The tabulated values are then a grid of points in time, t, and location r.

The temperature effect of an actual flash of charge C will be determined by scaling the values for the known standard cells by factor C as $CT(r,t)$. The actual temperatures are determined by the number of joules of energy deposited into the substrate and not simply by the charge. However, typical vector scan machines write with constant voltage and current density so charge is proportional to energy deposited.

The simplest library of standard cells would typically be characterized by two numerical parameters, the age at which the cell "matures" (defined in detail below) and a measure or measures of the spatial distribution of charge within the cell. The total charge deposited in standard cells is taken to be unity and scaled for the actual deposited charge as needed during temperature computation. More refined characterizations might include a higher order moment expansion for the spatial distribution and temporal distributions of charge deposited in each standard cell. However, to clearly demonstrate the present invention, a cell is considered to be defined by its "zero moment of charge" or total charge (to which temperature is proportional). The first approximation considers the total charge as deposited at the first moment location of the actual charge distribution, namely at the spatial charge centroid, and will be described in detail as the single parameter characterizing a cell. Use of higher order moments to catalog standard cells merely increases the size and complexity of data storage and retrieval in a straight forward manner and is included within the scope of the present invention.

Thus, for this embodiment of the present invention, there will be indices describing the normalized charge distributions in space and time by which a standard cell is catalogued (and, hence, retrieved) in the standard library. The data stored under these indices comprises a numerical grid of values giving the increment in temperature $\Delta T$ caused at point P on the resist by that particular standard cell as a function of distance in the plane of the resist $(\xi,\eta)$ from the standard cell's charge centroid to point P, and also the increment in temperature caused at point P at a time $\tau$ after the standard cell was written. That is, for total charge deposited q, the standard cell is that cell whose indices most nearly match those of the cell whose effect on resist temperature is to be determined. This standard cell contains values for temperature increments $\Delta T(\xi,\eta,\tau)$ in which the location of point P in the resist plane is made explicit. The temperature of the written cell will be $q\Delta T(\xi,\eta,\tau)$. For some practical purposes, the heating by a particular cell will be cylindrically symmetric about the location of the cell. Hence, $\Delta T$ will depend only on the distance from the flash to the point $P(x,y)$ in the plane of the wafer. Since vector $\rho=(\xi,\eta)$ and $\rho=|\rho|$, the distance irrespective of direction, is a single number. The library of standard cells in this embodiment of the present invention consists of a two dimensional table of values for the incremental temperature $\Delta T(\rho,\tau)$ for unit charge, indexed by the charge distribution indices.

When writing point P the temperature of the resist at the point to be written is determined as follows:

a) Identify the previously written cells that have non-negligible contributions to the temperature at P.

b) For each cell identified in step (a), identify the cell in the standard cell library most closely matching that cell in terms of the charge distribution indices. From the table retrieved from the library as $\Delta T$, identify the value of $\Delta T(\rho,\tau)$ most closely matching the cell in values of $\rho$ and $\tau$. If the current cell charge is q, its temperature contribution to the current writing grid point will be q $\Delta T$. Temperature lookup may take the nearest tabular point or make use of an interpolation scheme in several variables, and is not limited to simple linear interpolation. The present invention does not depend on the precise details of the interpolation scheme used.

c) Increment the temperature at point P according to the library value obtained in step (b).

d) Repeat steps (a), (b) and (c) for all cells affecting the temperature at P to determine the temperature at point P.

We now describe the construction of a library of standard cells that is to be used pursuant to the present invention for performing steps (a)–(d) above.

Throughout the descriptions herein, we assume that a single e-beam voltage is used. The only variables when writing, apart from flash position, are the time of exposure, (or dwell time) and the flash area. The product of these numbers is proportional to the charge deposited. It would be advantageous on vector scan machines for the pattern generator to deliver this number rather than have the heating processor compute it. If the beam current density is varied, it is not be necessary to recompute the standard cell library as scaling laws will be applied.

To be concrete in our discussion, we will refer to a standard beam current density throughout and assume that dwell time multiplied by flash area is proportional to charge deposited. Scaling may be applied as needed. We note, however, scaling is not valid for variations in beam voltage as voltage determines electron penetration depth, size of deposited ball of heat, and other non-linear, non-scalable effects. Thus, a new standard cell library needs to be computed for different beam voltages and different substrate materials.

The thermal properties of the substrate are presumed to be known and independent of substrate temperature. The procedures described herein would typically need to be redone if the thermal properties of the substrate change from substrate to substrate having different compositions.

The library of standard cells is constructed as follows:

i) Properties of a single electron flash are postulated, including beam voltage. It is found pursuant to one embodiment of the present invention that heat deposition in the substrate is adequately represented by the assumption that the incident electron flash is a point, small disk or gaussian distribution. Simulations pursuant to the present invention can be performed for more complex flash cross sections, or a range of flash shapes, if necessary.

ii) For the flash properties defined in (i), a Monte Carlo calculation is performed to ascertain the heat deposited in the substrate which requires a definition of the substrate layers and materials. The result of this calculation is a three dimensional table of values Q(x, y, z) giving the amount of energy deposited at points (x,y,z) in the substrate in watts/cm$^3$ for example, for a single flash. These values determine the source term used in Eq. (1).

iii) A grid in time is selected for the flash duration. Typically, 100 ns, 200 ns, 500 ns, (ns=nanosecond) 1 $\mu$s, 2 $\mu$s, 5 $\mu$s, 10 $\mu$s are found to be adequate in the practice of the present invention, although there is no inherent limitation or restriction to these values and others may equally well be employed. For each time value selected (say 100 ns), a commercial thermal diffusion program (ANSYS, for example) is used to compute temperature as follows:

iii.a) At time zero, t=0, ANSYS or an equivalent program is begun ("ANSYS" in brief including therein programs giving substantially equivalent results). There is no initial source of heat at t=0. However, immediately at t=0, heat is presumed to be generated through impact of the electron flash in a spatial distribution given by Q(x,y,z). The results of the Monte Carlo simulation provide Q(x,y,z) information, presumed to be uniformly generated for the duration of the flash. ANSYS is run for the duration of the flash, making use of Q(x,y,z) from the Monte Carlo calculation and tracking thermal diffusion during the duration of the flash.

iii.b) When the time of the assumed flash is expired (that is, 100 ns in this example), no further heat is generated within the substrate by e-beam impact, so Q(x,y,z)=0 for all later times. ANSYS continues to calculate the evolution of resist temperature in space and in time.

iii.c) At an appropriate grid of time values during the operation of ANSYS, a "snapshot" of the temperature distribution is stored in our library. This snapshot is the temperature value given by ANSYS for points in space at that particular time. However, we are only interested in points on the surface of the wafer lying in the resist, z=0. Further, for most cases of practical interest, we are only interested in the distance of the particular point from the flash (or centroid of the flash), r=$\sqrt{(x^2+y^2)}$. It is anticipated that in most cases of practical interest, the heat will be deposited relatively deep in the substrate such that essentially no heat reaches the resist surface while the flash is on (that is , when Q(x,y,z)$\neq$0). However, this is not an inherent limitation in the present invention. Time "snapshots" may be taken at times during the flash if required to give adequate accuracy in the determination of proximity heating.

iii.d) Steps (iii.a), (iii.b), (iii.c) are repeated for the desired time grid as specified in (iii).

The library of standard cells is now constructed giving temperature increments $\Delta T(r,\tau)$, at various distances in space and time from each cell. Because we design each standard cell to cover a typical distribution, we know where the cell centroid will be located in space and in time. The cells are composed of groups of flashes of the anticipated dwell time covering anticipated ranges in space and in time. It is not necessary to solve the thermal diffusion equation again. Rather, we can determine the temperature on the resist surface at any distance and after any elapsed time from the space-time centroid of the group of flashes that compose the cell by superposition of the temperature of the individual cell flash members interpolated from the table or tables described above and scaled to the appropriate flash energy. Strictly speaking, we need to know the flash dwell times of the component flashes but it would be sufficiently accurate in practice to group these coarsely into dwells of, for example, 100 nsec, 1 $\mu$sec, and 10 $\mu$sec. For a given case, only one of these will typically be needed. Very little difference will be found in practice (at high beam voltages) between temperatures for 100 nsec and 1 $\mu$sec flashes for the same deposited energy. However, if we knew that for a particular pattern most of the flashes were (say) 250 nsec dwell, we should include that case in the flash temperature library. For cells that represent a single line of flashes, there may be enough in-plane (x,y) asymmetry that we must tabulate temperature as a function of three space-time values (x,y,t) rather than just two, |r| and t. However, if computer memory and other resources permit, three space-time quantities, (x,y,t) can be used.

2) Agglomeration of Pattern Flashes into Cells

To determine proximity heating and to correct the pattern writing to compensate, it is necessary to agglomerate the written pattern into cells that may then be compared with cells from the standard cell library. The thermal effect of these cells on later writing is determined by the temperature effects extracted from the library for those entries corresponding to the cells actually written ("snapped" or interpolated). We describe in this section the presently preferred embodiments for agglomerating flashes into cells.

Figure 6:
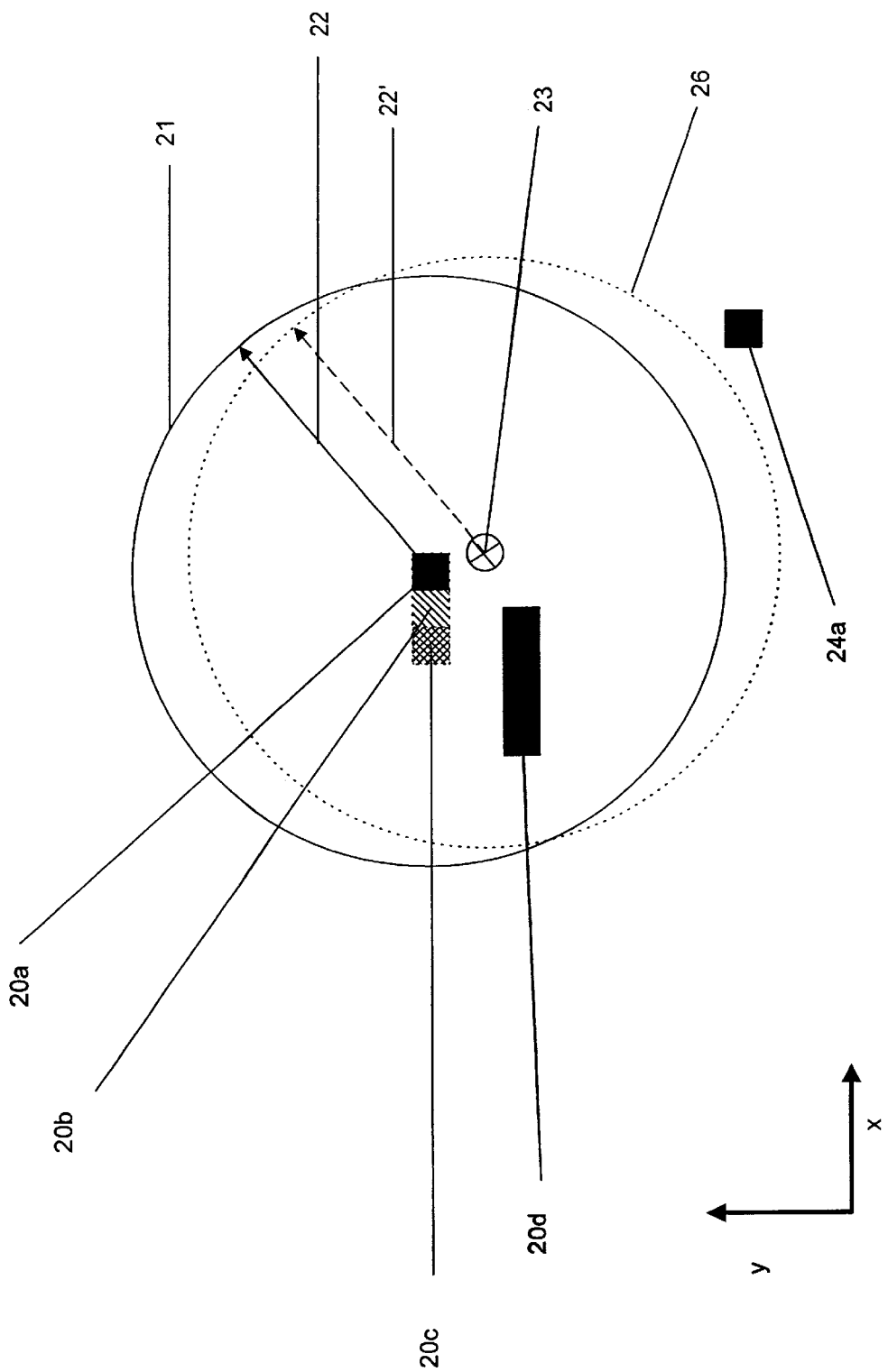
FIG. 6: Schematic depiction of agglomeration of flashes into cells.

FIG. 6 depicts a sequence of flashes written in order 20*a*, 20*b*, 20*c*, as viewed from above along the direction of the incident e-beam. The flashes are depicted as square in FIG. 6 purely for purposes of illustration. Rectangular, circular or more complex shapes may be used, or the e-beam may be dragged while on across a portion of the substrate, all within the scope of the present invention. Additionally, various levels of beam current may be employed, not necessarily limited to full-on or full-off (taking care to scale for comparison with the standard cell library).

In explaining the construction of a cell, it is helpful to keep in mind how the information will be used once the cell is fully assembled. To determine heating at later writing points caused by this cell (in other words, heating caused by this agglomeration of flashes), we will need to specify an effective location of this cell in the (x,y) plane, and the effective time at which this cell was written, and the effective charge (or duration) of the writing contributing to this cell. This information permits us to associate this cell with a cell in the standard library and extract therefrom resist heating information for use in correcting later writing on the wafer surface.

For purposes of illustration, we assume that flash 20*a* is the first flash written of a new cell. We specify below the conditions under which a cell is considered "mature" and closed to further writing. Thus, flash 20*a* will either be the first flash following (or causing) a cell closure, or the first flash written on the mask or wafer. Flash 20*a* initiates the process of locating the cell in space and time, and determining its charge.

1) A radius 22 is defined having the (x,y) location of flash 20a as its origin. Radius 22 is a parameter supplied by the engineer. It is anticipated that radius 22 will be approximately the electron diffusion range under the conditions of the present writing, but deviations larger or smaller are not excluded from the scope of the present invention as such may be helpful in making the present processes more efficient.

2) Flash 20a "starts the clock" that will determine the effective time at which this cell was written. Thus, flash 20a occurs at time t=0.

3) A second flash, 20b, is written. The cell "charge centroid" is determined as the weighted mean of 20a and 20b, weighted by the relative charges deposited in flashes 20a and 20b. That is, if $(x_a, y_a)$ is the central point of flash 20a during which charge $q_a$ is deposited, and $(x_b, y_b)$ is the central point of flash 20b during which charge $q_b$ is deposited, then the cell charge centroid after these two flashes is located at $(x_o, y_o)$. where $$x_o = (q_a x_a + q_b x_b)/(q_a + q_b),$$

and $$y_o = (q_a y_a + q_b y_b)/(q_b + q_b). \quad \text{Eq. (2)}$$

4) In addition to the charge centroid defied by Eq. (2), we define a "time centroid" in an analogous manner. If ta is the mean time during which flash 20a deposits charge qa (zero for the first flash in a cell, but non-zero for later flashes), and tb is the mean time during which flash 20b deposits charge qb, then we define the "time centroid" as $$t_o = (q_a t_a + q_b t_b)/(q_a + q_b). \quad \text{Eq. (3)}$$

Equations (2) and (3) are used to update the charge centroid and time centroid as later flashes are written, such as 20c, using the space and time coordinates for 20c and the space time coordinates previously computed for the charge and time centroids. Thus, as later flashes cause a smaller fractional change in the total charge within the cell, the charge centroid and time centroid change less and less. It is not required that the writing within the cell be contiguous. Flash 20d is also within the cell. Nor is it required that flashes within the cell be non-overlapping. The above procedure for calculating and updating the charge and time centroids may be applied to both cases.

As noted above, the function of constructing such a "cell" is to agglomerate the heating effects of numerous flashes within the cell into single space, time, charge coordinates for use in selecting the correct heating information from the standard cell library. To this end, it is preferred in the present invention to weight both space and time coordinates by the charge deposited.

As the charge centroid is updated with additional flashes, the center radius of the cell is moved from place to place following the charge centroid. That is, the radius of the cell, 22, is fixed at the outset and not changed during the construction of a cell. However, the center of the cell is always placed at the location of the charge centroid as most recently updated. If the charge centroid shifts to location 23, the cell is now 26, having the same length radius denoted by 22'.

Flashes continue to impact the substrate and the charge centroid and time centroid continue to be updated until cell "maturity" occurs. Once cell maturity has been declared, the cell is considered closed. No subsequent flash will be allowed to change either the charge centroid or the time centroid. Cell maturity is declared upon the first occurrence of either of two "termination conditions" 1) a flash impinging on the wafer surface outside of the cell, that is outside of circle 26, (such as flash 24a in FIG. 6) or 2) The cell becomes too "old", that is the cells time centroid exceeds a preset value. Because we want to limit the number of cells and keep the standard cell library within reasonable limits, we must limit the maximum radius and the maximum age of cells. The standard library must contain a range of prototypes that cover with sufficient accuracy the typical range of charge distributions in space and time that may occur.

Upon cell closure, the time centroid gives a charge-weighted elapsed time during which the cell was written, that is, its "age" at maturity or at time of cell closure. As noted above, this age is relevant in determining cell closure since one criteria is that cells not become too old before closing. However, once cell closure has occurred, determination of proximity heating requires a different time for comparison with the cells in the standard cell library. A determination of the temperature increment caused by cell k at the point presently being written requires knowledge of the time interval from the time of writing of cell k to the present time of writing. In the construction of cells pursuant to the procedures described herein, each cell's time centroid is given with reference to the birth of that particular cell as the origin of time, t=0. For comparison with the standard cells, each cell's time centroid should be offset by the clock time at which the cell was born. Thus, this embodiment of the present invention requires either temporary storage of the clock time of cell birth added to the cell's time centroid at cell maturity, or accumulation of time centroid from the clock time of cell birth rather than taking the beginning of time to be the cells particular (and unique) time of birth.

Upon cell maturity and closure to future writing the total charge deposited, the charge centroid and the cell's time centroid (as revised to include clock time) are also fixed. The charge centroid of the cell (point 23, for example) is the location from which distance is measured from the closed cell to the current point of writing in order to determine the temperature change caused by this closed cell upon the current writing point. The time centroid of the closed cell is the time from which elapsed time is measured from the time of writing the closed cell to the time of writing the present point on the wafer. As closed cells become too old (as measured by the time interval from the cell's time centroid to now, the time of writing) the heat deposited in the closed cell is effectively entirely dissipated. Thus, at this point in time, the closed cell may be dropped from consideration as it no longer contributes to proximity heating of the resist anywhere.

We note that the above prescription does not change if later flashes such as 24a create cells whose radius (not shown on FIG. 6) overlap closed cells. Nothing in the present procedure requires cells to be non-overlapping in space. Further, once cell 21 is closed, a later flash lying within cell 21 leads to the birth of a new cell lying substantially atop (now closed) cell 21. As noted above, one characteristic of vector scan patterning is the unpredictability of its writing in practice. The present invention achieves its greatest efficiencies when vector scan patterns tend to cluster into disjoint cells, but is not inherently so limited. At the possible cost of large amounts of computer time, even highly random patterns may be handled within the scope of the present invention.

3) Stenciling

Figure 7:
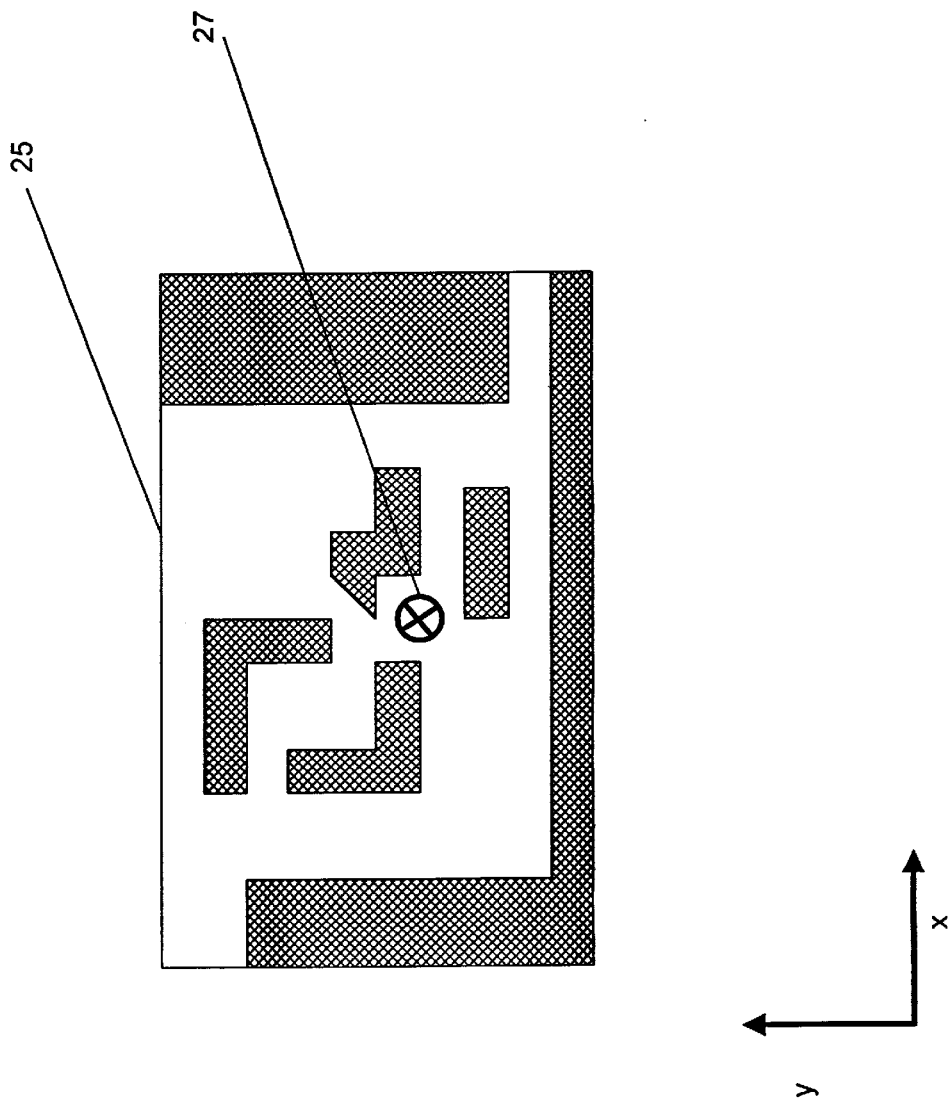
FIG. 7: Schematic depiction of stencil.

Some embodiments of e-beam lithography expose an entire pattern (for example, a memory cell) by directing a beam upon a stencil such that the lateral extent of the beam covers the entire stencil in a single flash. A schematic representation of a stencil (representing no electronic component in particular) is depicted as 25 in FIG. 7. Such flash exposure of stencils may also be included within the scope of the present invention but at the cost of some additional complexity in the creation of the library of standard cells. The basic complication is that the shape of the beam as it writes a stencil has an effect on the proximity heating effects caused by the cell thus written. Heretofore it has been presumed that the shape of the flash is not an important factor in determining the proximity heating effects caused by a particular flash. Only the deposited charge, location and time were considered important. Stencils require that this assumption be relaxed. Thus, the standard cell library must be catalogued by the various stencils employed in writing the wafer in addition to the parameters noted elsewhere. Different ANSYS runs would not need to be done for the particular stencil (or stencils) used in writing the complete pattern. The stencil pattern can be decomposed for thermal superposition purposes into a series of primitive library flashes, all considered to be written simultaneously, although in different spatial locations. The temperature, $T(\xi,\eta,\tau)$ for a prototype stencil is not an approximation because it exactly models all written stencils of the same type (within a rotation and/or reflection of coordinates. It is not envisioned that this additional cataloguing index will introduce serious complications into the actual practice of the present invention.

Charge centroid for a stencil is determined analogously to that defined above for a sequence of flashes. As a stencil is typically exposed in a single flash, the charge centroid is the location of the center of beam current passing through the stencil and impacting the wafer surface below, under the assumption (typically true in practice) that the beam current density is substantially constant over the area of the stencil This charge centroid is the location used for determining proximity heating caused by writing this stencil at the location of its centroid, depicted as 27 in FIG. 7. However, with stencils we need not make use of centroids, but rather any convenient point established by convention and consistently used may be employed for written stencils. Centroids are necessary for greatest accuracy in random agglomerations of flashes since no library prototype will exactly match what is actually written. In stencils, on the other hand, the prototype is an exact model of what is written.

4) Hierarchical Agglomeration into Super-cells, etc.

The agglomeration into cells described thus far envisions cells approximately $10\mu$ in lateral extent and about 10 $\mu$s in time to maturity (closure). This may contain approximately 100 flashes in common vector scan writing. This factor of 100 reduction in the number of distinct flashes that must be considered is important, but additional agglomeration is needed to reduce the proximity heating problem to a manageable scale that can be determined in real-time during the writing process with reasonably available technology. This is accomplished pursuant to the present invention by agglomeration of cells into super-cells, super-super-cells etc. hierarchically. A cell as described above is characterized by its charge centroid and time centroid. Several such cells can be agglomerated into a super cell by computing a weighted average of the component charge centroids and the component time centroids. The resulting super-cells may be further agglomerated to higher order, thus simplifying the computation to any arbitrary degree consistent with achieving the required level of accuracy.

5) Grid of Correction Points

Computing the temperature at the time and location of every written flash arising from past writing would be both prohibitive and unnecessary. Electron diffusion and subsequent thermal diffusion ensures that the temperature of high-voltage electron beam writing at a point does not change rapidly in space or in time. Hence we can define a coarse space time grid of correction points to which we "snap" the actual written flashes. This grid need be no finer than is required to represent temperature variations which are spatially blurred by electron diffusion in the substrate and by subsequent thermal diffusion. If the temperature at the grid point to which the current flash snaps has not previously been determined, it is computed by looking up the tabulated temperature that each cell of past writing would significantly contribute to the temperature of the current grid point and these temperatures are additively accumulated. The temperatures are obtained for each cell from the library counterpart that most nearly matches its defining characteristics, scaled by the cell charge and current density, using as arguments in the lookup the elapsed time and distance to the current grid point from the cell centroid in time and space. If subsequent flashes snap to the same grid point, the temperature need not be recomputed. The heating processor may be provided with look-ahead information from the pattern generator to anticipate which grid points next require temperatures or it may guess and compute partial temperatures at grid points proximate to the current writing point. Temperatures at future grid points are necessarily partial because they will be influenced by writing that has not yet occurred but these pre-calculations will reduce computing time when the final temperature at a grid point is needed. If the current flash snaps to a new grid point in space and time for which the temperature is unknown, the pattern generator can be stopped until the temperature is has been calculated. This characteristic of vector scan machines that permit such interruption was discussed earlier. At 50 kV beam voltage, the grid can be fairly coarse, say 5 or 10 microns so a machine writing with 1 um square flashes need not require such stoppages often. The coarseness in time depends on requirements but is in the microsecond range. Only two time planes are needed in memory because when time snaps to a new point the memory occupied by the previous time plane is freed. The spatial extent of the memory likewise is limited by the significant range of proximity heating which is in the millimeter range.

6) Self Heating of Flashes within a Cell

Two kinds of heating are to be considered:

6.1 Near-neighbor heating due to thermal conduction through the resist, chrome layer (if any) and through the upper layer of the substrate. Thermal calculations show that this type of heating need only consider near-neighbor flashes and can adequately be accounted for by a table lookup as each flash is written.

6.2 Heating from heat deeply deposited in the substrate due to earlier flashes in the same cell. It is anticipated in one implementation of the procedures described herein that cell ages will be sufficiently limited in high voltage lithography that the cell will be completed before significant heat from earlier flashes of the same cell reaches the surface. This may not always be possible. Advantage can be taken of the fact that the heat is deposited at depths large compared to the distance between adjacent flashes to allow simplified table lookup of precomputed temperatures due to past flashes.

The above procedures have been described with the tacit assumption that the pattern generator of the vector scan lithography machine has been designed so as to supply the heating processor with the area of each flash which will determine the deposited charge and the flash coordinates in the minor field, and that the location of the minor field is available as well as the coordinates of the major field in substrate coordinates.

Having described the invention in detail, those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described.

I claim:

1.) A method of agglomerating flashes during energy beam lithography comprising:
   a) defining a cell on the lithography substrate upon impact of a first flash with said substrate, wherein said cell has a predetermined delimiting radius, a predetermined delimiting age, a charge centroid at the center of said first flash and a time centroid at the time of writing of said first flash; and,
   b) writing a subsequent flash; and,
   c) determining if a termination condition has occurred; and,
   d) if a termination condition has not occurred,
      i) replacing said charge centroid with a revised charge centroid wherein said revised charge centroid is a charge-weighted average of said charge centroid and the charge centroid of said subsequent flash; and,
      ii) replacing said time centroid with a revised time centroid wherein said revised time centroid is a charge-weighted average of said time centroid and the time centroid of said subsequent flash; and,
      iii) writing a subsequent flash as in step (b) and repeating steps (c) and (d) hereof until a termination condition occurs; and,
   e) if a termination condition has occurred, storing the charge written in said cell, the time centroid of said cell and the charge centroid of said cell.

2.) A method as in claim 1 wherein said termination condition is the first to occur of
   a) writing a flash at a distance from said charge centroid greater than said delimiting radius; or,
   b) writing a present flash wherein the elapsed time from writing said first flash of said cell until writing said present flash exceeds said predetermined delimiting time.

3.) A method as in claim 1 wherein said flashes expose a stencil.

4.) A method as in claim 1 further comprising agglomerating cells into super-cells by determining the charge of said super-cell as the total charge of said cells, determining the charge centroid of said super-cell as a charge-weighted average of the charge centroids of said cells, and determining the time centroid of said super-cell as the charge-weighted average of the time-centroids of said cells.

5.) A method of agglomerating super-cells hierarchically into higher orders of agglomeration by iterative application of the method of claim 4 to successively higher orders of agglomeration.

6.) A method of determining the proximity heating of a resist during energy beam lithography comprising:
   a) constructing a standard library of cells for the flash conditions occurring during said lithography wherein said standard cells tabulate proximity heating as functions of space and time; and,
   b) associating each cell as written during said lithography with a standard cell from said library; and,
   c) accumulating during said lithography the proximity heating of the current writing point from the tabulated library of standard cells as associated with cells previously written.

7.) A method of determining proximity heating as in claim 6 wherein associating each cell with a standard cell occurs by snapping actual written flashes to a coarse grid of space-time points containing tabulated proximity heating data.

* * * * *